US012016113B2

(12) United States Patent
Pandit et al.

(10) Patent No.: US 12,016,113 B2
(45) Date of Patent: Jun. 18, 2024

(54) MITIGATING PDN INDUCED RF INTERFERENCE USING A STEPPED IMPEDANCE FILTER

(71) Applicant: Intel Corporation, Santa Clara, CA (US)

(72) Inventors: Vishram Shriram Pandit, Bangalore (IN); Yagnesh Vinodrai Waghela, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 663 days.

(21) Appl. No.: 17/131,501

(22) Filed: Dec. 22, 2020

(65) Prior Publication Data

US 2022/0201842 A1 Jun. 23, 2022

(51) Int. Cl.
*H01P 7/04* (2006.01)
*H04B 1/04* (2006.01)
(Continued)

(52) U.S. Cl.
CPC ......... *H05K 1/0233* (2013.01); *H04B 1/0475* (2013.01); *H04B 1/1018* (2013.01)

(58) Field of Classification Search
CPC ... H05K 1/0233; H04B 1/1018; H04B 1/0475
See application file for complete search history.

(56) References Cited

U.S. PATENT DOCUMENTS

| 4,178,524 A | * | 12/1979 | Ritter | ...................... G21D 7/00 310/305 |
| 6,781,486 B2 | * | 8/2004 | Killen | .................. H01P 1/2039 333/204 |

(Continued)

FOREIGN PATENT DOCUMENTS

| CN | 114665895 | | 6/2022 | |
| WO | WO-2016016524 A1 | * | 2/2016 | .............. B60L 53/14 |

OTHER PUBLICATIONS

"European Application Serial No. 21209041.9, Extended European Search Report dated May 11, 2022", 9 pgs.
(Continued)

*Primary Examiner* — Hai V Nguyen
(74) *Attorney, Agent, or Firm* — Schwegman Lundberg & Woessner, P.A.

(57) ABSTRACT

In some implementations, an electronics system includes a voltage regulator circuit of a PDN configured to generate a power signal, a printed circuit board (PCB) comprising a power rail to deliver the power signal to a digital circuit generating an interfering signal. The PDN radiating the interfering signal or its harmonics impacting the functionality of destination antenna and circuits (such as Wi-Fi, Bluetooth, cellular, etc.). The system includes a filtering element configured to filter an interfering signal generated by the digital circuit. The filtering element includes a first set of low impedance (low-Z) segments and a second set of high impedance (high-Z) segments. The low-Z and high-Z segments are formed using a copper trace of the power rail and are serially connected to each other. The filtering element forms a low pass filter and filters out high frequency interfering signal going to the destination antenna and circuits by radiated means.

20 Claims, 13 Drawing Sheets

(51) Int. Cl.
*H04B 1/10* (2006.01)
*H05K 1/02* (2006.01)

(56) References Cited

U.S. PATENT DOCUMENTS

| | | | | |
|---|---|---|---|---|
| 7,253,788 B2* | 8/2007 | Choi | ............... | H01Q 15/006 343/754 |
| 7,676,684 B2* | 3/2010 | Ando | ............... | G06F 13/1689 713/400 |
| 8,340,251 B2* | 12/2012 | Bertozzi | ............... | H05H 6/00 378/119 |
| 8,576,971 B2* | 11/2013 | Sefcik | ............... | G21B 1/23 376/102 |
| 8,595,924 B2* | 12/2013 | McKinzie, III | ............... | H05K 1/0236 29/601 |
| 8,837,661 B2* | 9/2014 | Wessel | ............... | G21B 1/03 376/188 |
| 9,640,318 B2* | 5/2017 | Rosenfeld | ............... | H01F 41/041 |
| 10,388,636 B2* | 8/2019 | Goh | ............... | H01L 25/16 |
| 10,903,809 B2* | 1/2021 | White | ............... | H03F 19/00 |
| 11,271,280 B2* | 3/2022 | Jeffrey | ............... | G06N 99/00 |
| 11,672,188 B2* | 6/2023 | Barends | ............... | H10N 60/12 257/31 |
| 11,777,462 B2* | 10/2023 | White | ............... | H03K 19/1954 330/4.6 |
| 2003/0203717 A1* | 10/2003 | Chuprun | ............... | H04B 7/18591 455/12.1 |
| 2004/0000971 A1* | 1/2004 | Killen | ............... | H01P 1/2039 333/204 |
| 2005/0046522 A1* | 3/2005 | Rawnick | ............... | H01P 1/2039 333/205 |
| 2006/0092093 A1* | 5/2006 | Choi | ............... | H01Q 15/006 343/909 |
| 2006/0273795 A1* | 12/2006 | Rieke | ............... | G01R 33/341 324/318 |
| 2007/0022773 A1* | 2/2007 | Wang | ............... | B23Q 11/127 62/93 |
| 2007/0131767 A1* | 6/2007 | Morrow | ............... | G06F 13/387 235/441 |
| 2007/0240008 A1* | 10/2007 | Ando | ............... | G06F 13/1689 713/400 |
| 2009/0065954 A1* | 3/2009 | Sharma | ............... | H01L 23/66 257/784 |
| 2010/0180437 A1* | 7/2010 | McKinzie, III | ............... | H01P 1/20 29/825 |
| 2011/0019789 A1* | 1/2011 | Wessel | ............... | H05H 3/06 376/158 |
| 2011/0200203 A1* | 8/2011 | Chu | ............... | H04R 1/10 381/74 |
| 2011/0255669 A1* | 10/2011 | Bertozzi | ............... | H05G 2/00 378/141 |
| 2011/0261919 A1* | 10/2011 | Sefcik | ............... | G21B 1/23 376/152 |
| 2014/0153201 A1* | 6/2014 | Cheng | ............... | H01R 12/716 361/748 |
| 2015/0162128 A1* | 6/2015 | Rosenfeld | ............... | H01F 38/14 336/200 |
| 2018/0136340 A1* | 5/2018 | Nelson | ............... | G01T 1/1611 |
| 2018/0331081 A1* | 11/2018 | Goh | ............... | H05K 3/303 |
| 2019/0109107 A1* | 4/2019 | Lee | ............... | H03H 7/42 |
| 2019/0199019 A1* | 6/2019 | Coteus | ............... | H01R 4/363 |
| 2019/0229690 A1* | 7/2019 | White | ............... | H03H 11/04 |
| 2019/0267957 A1* | 8/2019 | Lind | ............... | H03F 3/68 |
| 2020/0153286 A1* | 5/2020 | Mao | ............... | H02J 50/12 |
| 2020/0373643 A1* | 11/2020 | Darling | ............... | H01P 1/2056 |
| 2020/0395405 A1* | 12/2020 | Barends | ............... | H10N 60/855 |
| 2020/0403289 A1* | 12/2020 | Jeffrey | ............... | G06N 10/00 |
| 2022/0052662 A1* | 2/2022 | White | ............... | H03H 11/04 |
| 2022/0189677 A1* | 6/2022 | Blay | ............... | H03H 7/42 |
| 2022/0190851 A1* | 6/2022 | Pawliuk | ............... | H04B 1/0475 |
| 2022/0209410 A1* | 6/2022 | Lilja | ............... | C03C 17/06 |
| 2022/0321073 A1* | 10/2022 | Pla | ............... | H01P 1/2013 |
| 2022/0360230 A1* | 11/2022 | Marbell | ............... | H01L 23/66 |
| 2022/0399721 A1* | 12/2022 | Nielsen | ............... | G01R 27/16 |
| 2023/0270021 A1* | 8/2023 | Barends | ............... | H01P 3/003 257/31 |
| 2023/0346538 A1* | 11/2023 | Adler | ............... | H01Q 1/36 |

OTHER PUBLICATIONS

Jinwoo, Choi, "Noise Isolation in Mixed-Signal Systems Using Alternating Impedance Electromagnetic Bandgap (AI-EBG) Structure-Based Power Distribution Network (PDN)", IEEE Transactions on Advanced Packaging, IEEE Service Center, Piscataway, NJ, USA, vol. 33, No. 1, (Feb. 1, 2010), 11 pgs.

Tiwary, Anjani KR, "Electromagnetic Interference Reduction Using Electromagnetic Bandgap Structures", InterferenceandCompatibility, 2008. INCEMIC 2008. 10th International Conference on, IEEE, Piscataway, NJ, USA, (Nov. 26, 2008), 4 pgs.

"European Application Serial No. 21209041.9, Response filed Dec. 8, 2022 to Extended European Search Report dated May 11, 2022", 14 pgs.

* cited by examiner

MITIGATING PDN INDUCED RF INTERFERENCE USING A STEPPED IMPEDANCE FILTER

TECHNICAL FIELD

Various embodiments generally may relate to the field of signal interference mitigation, and more specifically, mitigating power delivery network (PDN) induced radio frequency (RF) interference using a stepped impedance filter (SIF).

BACKGROUND

In a Wi-Fi enabled wireless device, the antenna is operating in 2.4 GHz to 2.5 GHz and 5 GHz to 6 GHz bands. The circuitry in the System On Chip (SoC) or Application Processor of an electronics system, however, generates digital signals which may have a similar frequency as signals transmitted or received by the Wi-Fi antenna. Also, harmonics of the digital signal frequency may fall in the range of Wi-Fi signals. The noise of digital signals can couple to the antenna by radiated means. Due to this interference, the antenna cannot receive signals as per the specification and Wi-Fi signal processing may deteriorate. In addition to the above Wi-Fi example, similar interference may occur for Bluetooth, LTE, 5G cellular, GPS, and satellite-enabled wireless devices.

BRIEF DESCRIPTION OF THE DRAWINGS

In the drawings, like numerals may describe similar components in different views. Like numerals having different letter suffixes may represent different instances of similar components. Some embodiments are illustrated by way of example, and not limitation, in the figures of the accompanying drawings in which.

DETAILED DESCRIPTION

Figure 1:
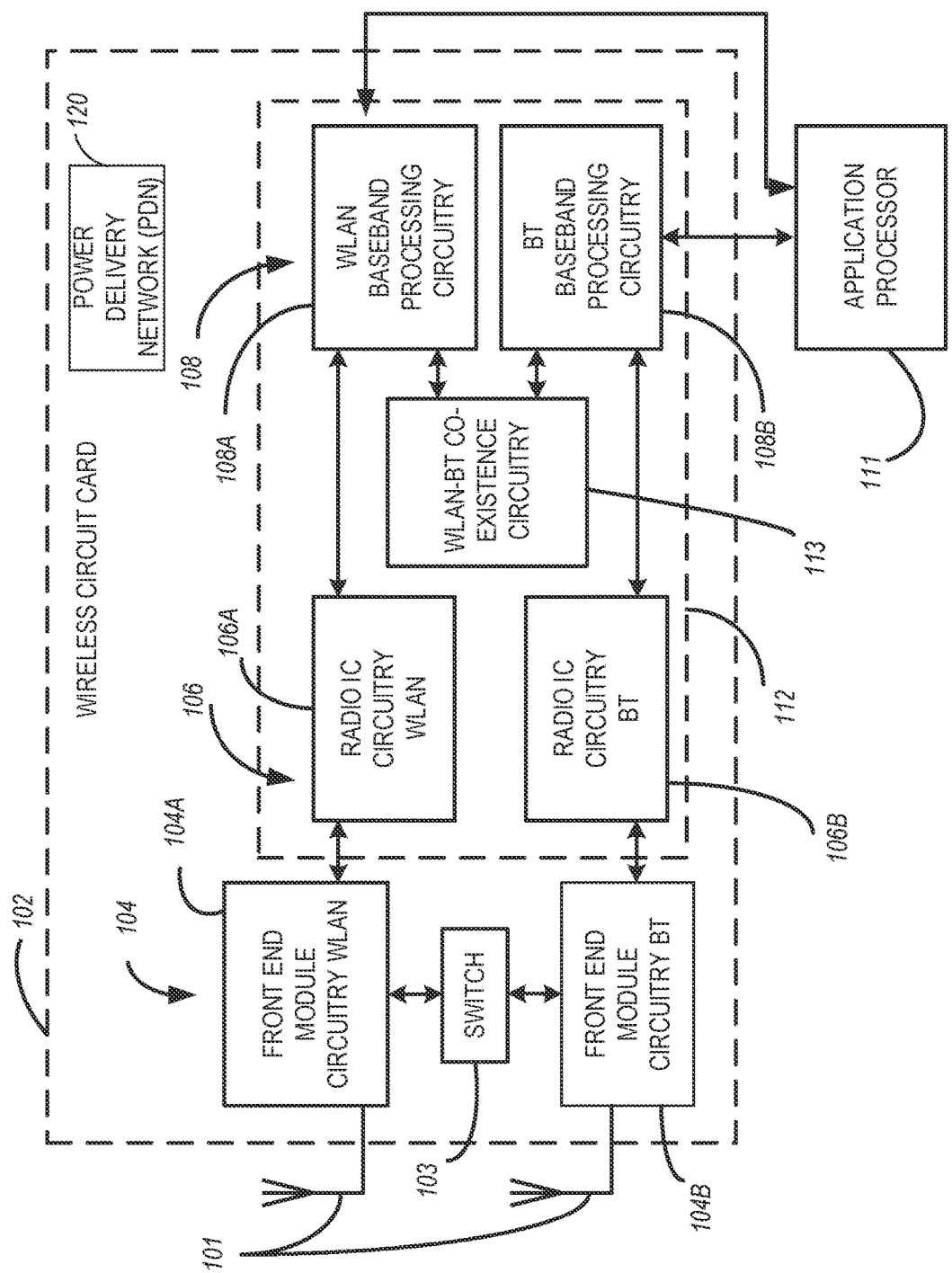
FIG. 1 is a block diagram of a radio architecture, in accordance with some embodiments.

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail.

The following description and the drawings sufficiently illustrate specific embodiments to enable those skilled in the art to practice them. Other embodiments may incorporate structural, logical, electrical, process, and other changes. Portions and features of some embodiments may be included in or substituted for, those of other embodiments. Embodiments outlined in the claims encompass all available equivalents of those claims.

Techniques disclosed herein can be used to perform PDN induced interfering signal mitigation using a stepped impedance filter. The PDN routing of electronics system circuitry can carry an interfering signal from the source (e.g., a digital circuit such as a circuit in the SoC or Application Processor device transmit, or Tx, chain) to the destination (e.g., the device antenna). In some aspects, ferrite beads and decoupling capacitors may be used on the PDN routing structures to mitigate the interfering signals. The ferrite beads and the capacitors, however, can be bulky and can increase the implementation cost. In other aspects and as described in the figures, a stepped impedance filter (SIF) may be used for interfering signal mitigation caused by a device PDN. More specifically, an interfering signal can be generated by the SoC or Application Processor device circuit and can couple onto power rails of the PDN which can then carry the interfering signal to the device antenna by radiated means. A SIF can be formed using a copper trace of the power rail and can be placed closed to the interfering signal source (e.g., close to the SoC or Application Processor digital circuit generating the interfering signal). The SIF can act as a low-pass filter and can filter out signals in a specific frequency range so that interfering signals in that frequency range will not radiate and will not couple to the antenna. For example, components (or segments) of the SIF can be configured with dimensions (e.g., length, width, and height)

based on the desired frequency that has to be filtered out. More detailed aspects of the interference mitigation techniques using a SIF are provided in connection with FIGS. 5-14.

FIG. 1 is a block diagram of a radio architecture 100 in accordance with some embodiments. The radio architecture 100 may be implemented in a computing device including user equipment (UE), a base station (e.g., a next generation Node-B (gNB), enhanced Node-B (eNB)), a smartphone, or another type of wired or wireless device using synthesizer circuitry with frequency estimation. The radio architecture 100 may include radio front-end module (FEM) circuitry 104, radio IC circuitry 106, and baseband processing circuitry 108. Radio architecture 100 as shown includes both Wireless Local Area Network (WLAN) functionality and Bluetooth (BT) functionality although embodiments are not so limited. In this disclosure, "WLAN" and "Wi-Fi" are used interchangeably.

FEM circuitry 104 may include a WLAN or Wi-Fi FEM circuitry 104A and a Bluetooth (BT) FEM circuitry 104B. The WLAN FEM circuitry 104A may include a receive signal path comprising circuitry configured to operate on WLAN RF signals received from one or more antennas 101, to amplify the received signals, and to provide the amplified versions of the received signals to the WLAN radio IC circuitry 106A for further processing. The BT FEM circuitry 104B may include a receive signal path which may include circuitry configured to operate on BT RF signals received from the one or more antennas 101, to amplify the received signals and to provide the amplified versions of the received signals to the BT radio IC circuitry 106B for further processing. The FEM circuitry 104A may also include a transmit signal path which may include circuitry configured to amplify WLAN signals provided by the radio IC circuitry 106A for wireless transmission by the one or more antennas 101. Besides, the FEM circuitry 104B may also include a transmit signal path which may include circuitry configured to amplify BT signals provided by the radio IC circuitry 106B for wireless transmission by the one or more antennas. In the embodiment of FIG. 1, although FEM 104A and FEM 104B are shown as being distinct from one another, embodiments are not so limited and include within their scope the use of a FEM (not shown) that includes a transmit path and/or a receive path for both WLAN and BT signals, or the use of one or more FEM circuitries where at least some of the FEM circuitries share transmit and/or receive signal paths for both WLAN and BT signals.

Radio IC circuitry 106 as shown may include WLAN radio IC circuitry 106A and BT radio IC circuitry 106B. The WLAN radio IC circuitry 106A may include a receive signal path which may include circuitry to down-convert WLAN RF signals received from the FEM circuitry 104A and provide baseband signals to WLAN baseband processing circuitry 108A. The BT radio IC circuitry 106B may, in turn, include a receive signal path which may include circuitry to down-convert BT RF signals received from the FEM circuitry 104B and provide baseband signals to BT baseband processing circuitry 108B. The WLAN radio IC circuitry 106A may also include a transmit signal path which may include circuitry to up-convert WLAN baseband signals provided by the WLAN baseband processing circuitry 108A and provide WLAN RF output signals to the FEM circuitry 104A for subsequent wireless transmission by the one or more antennas 101. The BT radio IC circuitry 106B may also include a transmit signal path which may include circuitry to up-convert BT baseband signals provided by the BT baseband processing circuitry 108B and provide BT RF output signals to the FEM circuitry 104B for subsequent wireless transmission by the one or more antennas 101. In the embodiment of FIG. 1, although radio IC circuitries 106A and 106B are shown as being distinct from one another, embodiments are not so limited and include within their scope the use of a radio IC circuitry (not shown) that includes a transmit signal path and/or a receive signal path for both WLAN and BT signals, or the use of one or more radio IC circuitries where at least some of the radio IC circuitries share transmit and/or receive signal paths for both WLAN and BT signals.

Baseband processing circuitry 108 may include a WLAN baseband processing circuitry 108A and a BT baseband processing circuitry 108B. The WLAN baseband processing circuitry 108A may include a memory, such as, for example, a set of RAM arrays in a Fast Fourier Transform (FFT) or Inverse Fast Fourier Transform (IFFT) block (not shown) of the WLAN baseband processing circuitry 108A. Each of the WLAN baseband processing circuitry 108A and the BT baseband processing circuitry 108B may further include one or more processors and control logic to process the signals received from the corresponding WLAN or BT receive signal path of the radio IC circuitry 106, and to also generate corresponding WLAN or BT baseband signals for the transmit signal path of the radio IC circuitry 106. Each of the baseband processing circuitries 108A and 108B may further include physical layer (PHY) and medium access control layer (MAC) circuitry and may further interface with the application processor 111 for generation and processing of the baseband signals and for controlling operations of the radio IC circuitry 106.

Referring still to FIG. 1, according to the shown embodiment, WLAN-BT coexistence circuitry 113 may include logic providing an interface between the WLAN baseband processing circuitry 108A and the BT baseband processing circuitry 108B to enable use cases requiring WLAN and BT coexistence. In addition, a switch 103 may be provided between the WLAN FEM circuitry 104A and the BT FEM circuitry 104B to allow switching between the WLAN and BT radios according to application needs. In addition, although the one or more antennas 101 are depicted as being respectively connected to the WLAN FEM circuitry 104A and the BT FEM circuitry 104B, embodiments include within their scope the sharing of one or more antennas as between the WLAN and BT FEMs, or the provision of more than one antenna connected to each of FEM 104A or 104B.

In some embodiments, the front-end module circuitry 104, the radio IC circuitry 106, and the baseband processing circuitry 108 may be provided on a wireless device such as wireless radio card 102. In some other embodiments, the one or more antennas 101, the FEM circuitry 104, and the radio IC circuitry 106 may be provided on a single radio card. In some other embodiments, the radio IC circuitry 106 and the baseband processing circuitry 108 may be provided on a single chip or integrated circuit (IC), such as IC 112.

In some embodiments, the wireless radio card 102 may include a WLAN radio card and may be configured for Wi-Fi communications, although the scope of the embodiments is not limited in this respect. In some of these embodiments, the radio architecture 100 may be configured to receive and transmit orthogonal frequency division multiplexed (OFDM) or orthogonal frequency division multiple access (OFDMA) communication signals over a multicarrier communication channel. The OFDM or OFDMA signals may comprise a plurality of orthogonal subcarriers. In some embodiments, the wireless radio card 102 may include a platform controller hub (PCH) system-on-a-chip (SOC) and a central processing unit (CPU)/host SOC or Application Processor.

The wireless radio card 102 further includes a power delivery network (PDN) 120, which uses power rails to deliver power (or power signals) to different circuitry within the wireless radio card 102. In some embodiments, a copper trace of a power rail in the proximity to a circuit can be configured with a SIF to mitigate interfering signals generated by the circuit so that the interfering signal is not delivered to the antenna system. Different configurations and signal mitigation techniques are discussed in connection with FIGS. 5-14.

In some of these multicarrier embodiments, radio architecture 100 may be part of a Wi-Fi communication station (STA) such as a wireless access point (AP), a base station, or a mobile device including a Wi-Fi enabled device. In some of these embodiments, radio architecture 100 may be configured to transmit and receive signals in accordance with specific communication standards and/or protocols, such as any of the Institute of Electrical and Electronics Engineers (IEEE) standards including, 802.11n-2009, IEEE 802.11-2012, 802.11n-2009, 802.11ac, IEEE 802.11-2016, and/or 802.1 lax standards and/or proposed specifications for WLANs, although the scope of embodiments is not limited in this respect. Radio architecture 100 may also be suitable to transmit and/or receive communications in accordance with other techniques and standards, including a $3^{rd}$ Generation Partnership Project (3GPP) standard, including a communication standard used in connection with 5G or new radio (NR) communications.

In some embodiments, the radio architecture 100 may be configured for high-efficiency (HE) Wi-Fi communications in accordance with the IEEE 802.1 lax standard or another standard associated with wireless communications. In these embodiments, the radio architecture 100 may be configured to communicate in accordance with an OFDMA technique, although the scope of the embodiments is not limited in this respect.

In some other embodiments, the radio architecture 100 may be configured to transmit and receive signals transmitted using one or more other modulation techniques such as spread spectrum modulation (e.g., direct sequence code division multiple access (DS-CDMA) and/or frequency hopping code division multiple access (FH-CDMA)), time-division multiplexing (TDM) modulation, and/or frequency-division multiplexing (FDM) modulation, although the scope of the embodiments is not limited in this respect.

In some embodiments, as further shown in FIG. 1, the BT baseband processing circuitry 108B may be compliant with a Bluetooth (BT) connectivity standard such as Bluetooth, Bluetooth 4.0 or Bluetooth 5.0, or any other iteration of the Bluetooth Standard. In embodiments that include BT functionality as shown for example in FIG. 1, the radio architecture 100 may be configured to establish a BT synchronous connection-oriented (SCO) link and or a BT low energy (BT LE) link. In some of the embodiments that include functionality, the radio architecture 100 may be configured to establish an extended SCO (eSCO) link for BT communications, although the scope of the embodiments is not limited in this respect. In some of these embodiments that include a BT functionality, the radio architecture may be configured to engage in a BT Asynchronous Connection-Less (ACL) communications, although the scope of the embodiments is not limited in this respect. In some embodiments, as shown in FIG. 1, the functions of a BT radio card and WLAN radio card may be combined on a single wireless radio card, such as the single wireless radio card 102, although embodiments are not so limited, and include within their scope discrete WLAN and BT radio cards In some embodiments, the radio architecture 100 may include other radio cards, such as a cellular radio card configured for cellular (e.g., 3GPP such as LTE, LTE-Advanced, 5G communications, or satellite communications such as very high-frequency communications).

In some IEEE 802.11 embodiments, the radio architecture 100 may be configured for communication over various channel bandwidths including bandwidths having center frequencies of about 900 MHz, 2.4 GHz, 5 GHz, 28 GHz-60 GHz, and 12 GHz, and bandwidths of about 1 MHz, 2 MHz, 2.5 MHz, 4 MHz, 5 MHz, 8 MHz, 10 MHz, 16 MHz, 20 MHz, 40 MHz, 80 MHz (with contiguous bandwidths) or 80+80 MHz (160 MHz) (with non-contiguous bandwidths). In some embodiments, a 320 MHz channel bandwidth may be used. The scope of the embodiments is not limited with respect to the above center frequencies, however.

Figure 2:
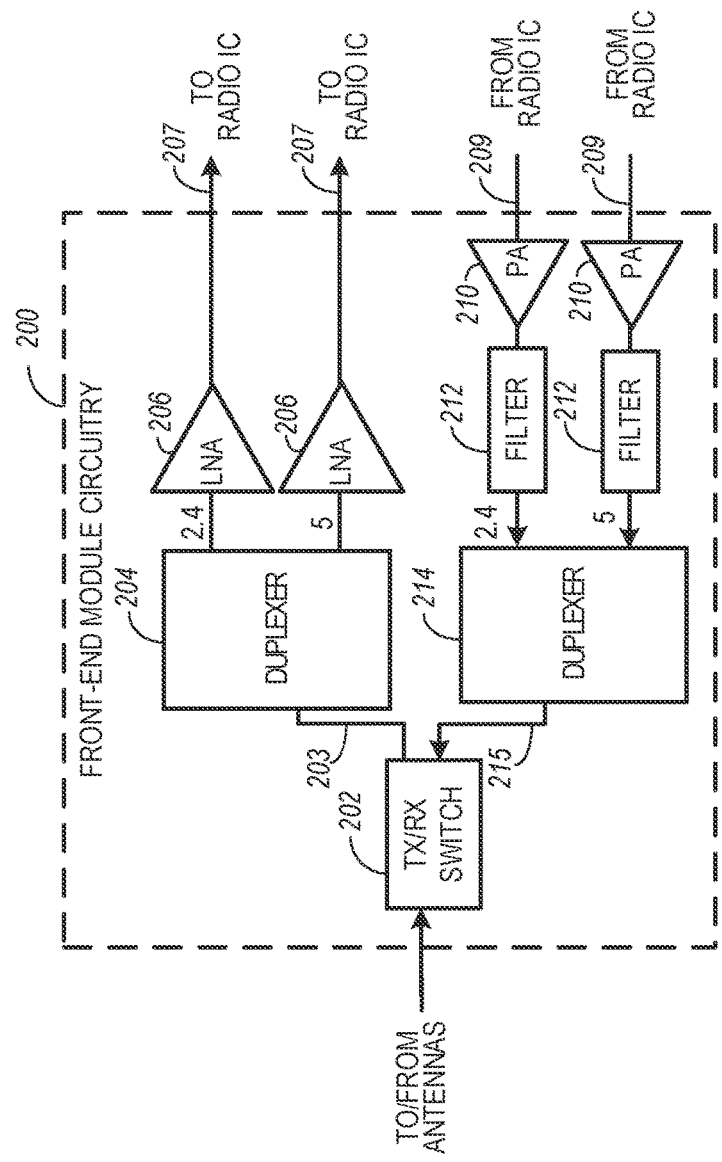
FIG. 2 illustrates a front-end module circuitry for use in the radio architecture of FIG. 1, in accordance with some embodiments.

FIG. 2 illustrates FEM circuitry 200 in accordance with some embodiments. The FEM circuitry 200 is one example of circuitry that may be suitable for use as the WLAN and/or BT FEM circuitry 104A/104B (FIG. 1), although other circuitry configurations may also be suitable.

In some embodiments, the FEM circuitry 200 may include a TX/RX switch 202 to switch between transmit (TX) mode and receive (RX) mode operation. The FEM circuitry 200 may include a receive signal path and a transmit signal path. The receive signal path of the FEM circuitry 200 may include a low-noise amplifier (LNA) 206 to amplify received RF signals 203 and provide the amplified received RF signals 207 as an output (e.g., to the radio IC circuitry 106 (FIG. 1)). The transmit signal path of the FEM circuitry 200 may include a power amplifier (PA) to amplify input RF signals 209 (e.g., provided by the radio IC circuitry 106), and one or more filters 212, such as band-pass filters (BPFs), low-pass filters (LPFs) or other types of filters, to generate RF signals 215 for subsequent transmission (e.g., by the one or more antennas 101 (FIG. 1)).

In some dual-mode embodiments for Wi-Fi communication, the FEM circuitry 200 may be configured to operate in either the 2.4 GHz frequency spectrum or the 5 GHz frequency spectrum. In these embodiments, the receive signal path of the FEM circuitry 200 may include a receive signal path duplexer 204 to separate the signals from each spectrum as well as provide a separate LNA 206 for each spectrum as shown. In these embodiments, the transmit signal path of the FEM circuitry 200 may also include a power amplifier 210 and one or more filters 212, such as a BPF, an LPF, or another type of filter for each frequency spectrum, and a transmit signal path duplexer 214 to provide the signals of one of the different spectrums onto a single transmit path for subsequent transmission by the one or more antennas 101 (FIG. 1). In some embodiments, BT communications may utilize the 2.4 GHz signal paths and may utilize the same FEM circuitry 200 as the one used for WLAN communications. As mentioned earlier, the FEM circuitry is not limited to WLAN and BT modes. In some embodiments, the FEM circuitry can be used for cellular bands, 5G bands, millimeter-wave (mmW) bands, and satellite bands.

Figure 3:
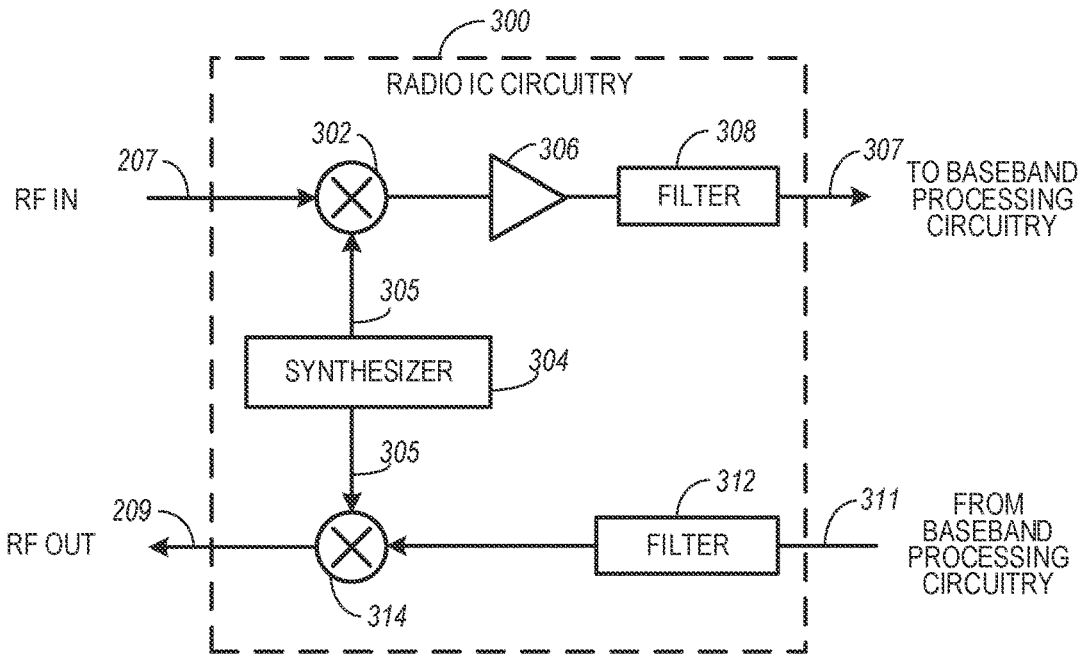
FIG. 3 illustrates a radio IC circuitry for use in the radio architecture of FIG. 1, in accordance with some embodiments.

FIG. 3 illustrates radio IC circuitry 300 in accordance with some embodiments. The radio IC circuitry 300 is one example of circuitry that may be suitable for use as the WLAN or BT radio IC circuitry 106A/106B (in FIG. 1), although other circuitry configurations may also be suitable.

In some embodiments, the radio IC circuitry 300 may include a receive signal path and a transmit signal path. The receive signal path of the radio IC circuitry 300 may include mixer circuitry 302, such as, for example, down-conversion mixer circuitry, amplifier circuitry 306, and filter circuitry 308. The transmit signal path of the radio IC circuitry 300 may include at least filter circuitry 312 and mixer circuitry 314, such as up-conversion mixer circuitry. Radio IC circuitry 300 may also include synthesizer circuitry 304 for synthesizing a frequency 305 for use by the mixer circuitry 302 and the mixer circuitry 314. The mixer circuitry 302 and/or 314 may each, according to some embodiments, be configured to provide direct conversion functionality. The latter type of circuitry presents a much simpler architecture as compared with standard super-heterodyne mixer circuitries, and any flicker noise brought about by the same may be alleviated for example through the use of OFDM modulation. FIG. 3 illustrates only a simplified version of a radio IC circuitry and may include, although not shown, embodiments where each of the depicted circuitries may include more than one component. For instance, mixer circuitry 302 and/or 314 may each include one or more mixers, and filter circuitries 308 and/or 312 may each include one or more filters, such as one or more BPFs and/or LPFs according to application needs. For example, when mixer circuitries are of the direct-conversion type, they may each include two or more mixers.

In some embodiments, mixer circuitry 302 may be configured to down-convert RF signals 207 received from the FEM circuitry 104 (in FIG. 1) based on the synthesized frequency 305 provided by the synthesizer circuitry 304. The amplifier circuitry 306 may be configured to amplify the down-converted signals and the filter circuitry 308 may include an LPF configured to remove unwanted signals from the down-converted signals to generate output baseband signals 307. Output baseband signals 307 may be provided to the baseband processing circuitry 108 (FIG. 1) for further processing. In some embodiments, the output baseband signals 307 may be zero-frequency baseband signals, although this is not a requirement. In some embodiments, mixer circuitry 302 may comprise passive mixers, although the scope of the embodiments is not limited in this respect.

In some embodiments, the mixer circuitry 314 may be configured to up-convert input baseband signals 311 based on the synthesized frequency 305 provided by the synthesizer circuitry 304 to generate RF output signals 209 for the FEM circuitry 104. The baseband signals 311 may be provided by the baseband processing circuitry 108 and may be filtered by filter circuitry 312. The filter circuitry 312 may include an LPF or a BPF, although the scope of the embodiments is not limited in this respect.

In some embodiments, the mixer circuitry 302 and the mixer circuitry 314 may each include two or more mixers and may be arranged for quadrature down-conversion and/or up-conversion respectively with the help of the synthesizer circuitry 304. In some embodiments, the mixer circuitry 302 and the mixer circuitry 314 may each include two or more mixers each configured for image rejection (e.g., Hartley image rejection). In some embodiments, the mixer circuitry 302 and the mixer circuitry 314 may be arranged for direct down-conversion and/or direct up-conversion, respectively. In some embodiments, the mixer circuitry 302 and the mixer circuitry 314 may be configured for super-heterodyne operation, although this is not a requirement.

Mixer circuitry 302 may comprise, according to one embodiment: quadrature passive mixers (e.g., for the in-phase (I) and quadrature-phase (Q) paths). In such an embodiment, RF input signal 207 from FIG. 2 may be down-converted to provide I and Q baseband output signals to be sent to the baseband processor.

Quadrature passive mixers may be driven by zero and ninety-degree time-varying LO switching signals provided by a quadrature circuitry which may be configured to receive a LO frequency (fLO) from a local oscillator or a synthesizer, such as LO frequency 305 of synthesizer circuitry 304 (FIG. 3). In some embodiments, the LO frequency may be the carrier frequency, while in other embodiments, the LO frequency may be a fraction of the carrier frequency (e.g., one-half the carrier frequency, one-third the carrier frequency). In some embodiments, the zero and ninety-degree time-varying switching signals may be generated by the synthesizer, although the scope of the embodiments is not limited in this respect.

In some embodiments, the LO signals may differ in the duty cycle (the percentage of one period in which the LO signal is high) and/or offset (the difference between start points of the period). In some embodiments, the LO signals may have a 25% duty cycle and a 50% offset. In some embodiments, each branch of the mixer circuitry (e.g., the in-phase (I) and quadrature-phase (Q) path) may operate at a 25% duty cycle, which may result in a significant reduction in power consumption.

The RF input signal 207 (FIG. 2) may comprise a balanced signal, although the scope of the embodiments is not limited in this respect. The I and Q baseband output signals may be provided to the low-noise amplifier, such as amplifier circuitry 306 (in FIG. 3) or to filter circuitry 308 (in FIG. 3).

In some embodiments, the output baseband signals 307 and the input baseband signals 311 may be analog, although the scope of the embodiments is not limited in this respect. In some alternate embodiments, the output baseband signals 307 and the input baseband signals 311 may be digital. In these alternate embodiments, the radio IC circuitry may include an analog-to-digital converter (ADC) and digital-to-analog converter (DAC) circuitry.

In some dual-mode embodiments, a separate radio IC circuitry may be provided for processing signals for each spectrum, or for other spectrums not mentioned here, although the scope of the embodiments is not limited in this respect.

In some embodiments, the synthesizer circuitry 304 may be a fractional-N synthesizer or a fractional N/N+1 synthesizer, although the scope of the embodiments is not limited in this respect as other types of frequency synthesizers may be suitable. In some embodiments, the synthesizer circuitry 304 may be a delta-sigma synthesizer, a frequency multiplier, or a synthesizer comprising a phase-locked loop with a frequency divider. According to some embodiments, the synthesizer circuitry 304 may include a digital frequency synthesizer circuitry. An advantage of using a digital synthesizer circuitry is that, although it may still include some analog components, its footprint may be scaled down much more than the footprint of an analog synthesizer circuitry. In some embodiments, frequency input into synthesizer circuitry 304 may be provided by a voltage controlled oscillator (VCO), although that is not a requirement. A divider control input may further be provided by either the baseband processing circuitry 108 (in FIG. 1) or the application processor 111 (in FIG. 1) depending on the desired output frequency 305. In some embodiments, a divider control input (e.g., N) may be determined from a look-up table (e.g., within a Wi-Fi card) based on a channel number and a channel center frequency as determined or indicated by the application processor 111.

In some embodiments, synthesizer circuitry 304 may be configured to generate a carrier frequency as the output frequency 305, while in other embodiments, the output frequency 305 may be a fraction of the carrier frequency (e.g., one-half the carrier frequency, one-third the carrier frequency). In some embodiments, the output frequency 305 may be a LO frequency (fLO).

Figure 4:
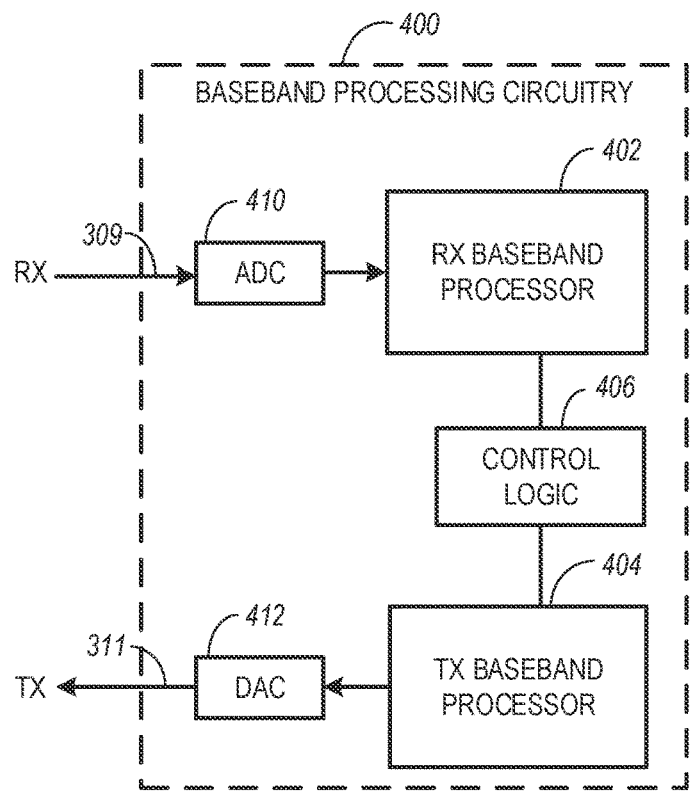
FIG. 4 illustrates a baseband processing circuitry for use in the radio architecture of FIG. 1, in accordance with some embodiments.

FIG. 4 illustrates a functional block diagram of baseband processing circuitry 400 in accordance with some embodiments. The baseband processing circuitry 400 is one example of circuitry that may be suitable for use as the baseband processing circuitry 108 (in FIG. 1), although other circuitry configurations may also be suitable. The baseband processing circuitry 400 may include a receive baseband processor (RX BBP) 402 for processing receive baseband signals 309 provided by the radio IC circuitry 106 (in FIG. 1) and a transmit baseband processor (TX BBP) 404 for generating transmit baseband signals 311 for the radio IC circuitry 106. The baseband processing circuitry 400 may also include control logic 406 for coordinating the operations of the baseband processing circuitry 400.

In some embodiments (e.g., when analog baseband signals are exchanged between the baseband processing circuitry 400 and the radio IC circuitry 106), the baseband processing circuitry 400 may include ADC 410 to convert analog baseband signals received from the radio IC circuitry 106 to digital baseband signals for processing by the RX BBP 402. In these embodiments, the baseband processing circuitry 400 may also include DAC 412 to convert digital baseband signals from the TX BBP 404 to analog baseband signals.

In some embodiments that communicate OFDM signals or OFDMA signals, such as through the baseband processing circuitry 108A, the TX BBP 404 may be configured to generate OFDM or OFDMA signals as appropriate for transmission by performing an inverse fast Fourier transform (IFFT). The RX BBP 402 may be configured to process received OFDM signals or OFDMA signals by performing an FFT. In some embodiments, the RX BBP 402 may be configured to detect the presence of an OFDM signal or OFDMA signal by performing an autocorrelation, to detect a preamble, such as a short preamble, and by performing a cross-correlation, to detect a long preamble. The preambles may be part of a predetermined frame structure for Wi-Fi communication.

Referring back to FIG. 1, in some embodiments, the one or more antennas 101 may each comprise one or more directional or omnidirectional antennas, including, for example, dipole antennas, monopole antennas, patch antennas, loop antennas, microstrip antennas, antennas for satellite communications, or other types of antennas suitable for transmission of RF signals. In some multiple-input multiple-output (MIMO) embodiments, the antennas may be effectively separated to take advantage of spatial diversity and the different channel characteristics that may result. The one or more antennas 101 may each include a set of phased-array antennas, although embodiments are not so limited.

Although the radio architecture 100 is illustrated as having several separate functional elements, one or more of the functional elements may be combined and may be implemented by combinations of software configured elements, such as processing elements including digital signal processors (DSPs), and/or other hardware elements. For example, some elements may comprise one or more microprocessors, DSPs, field-programmable gate arrays (FPGAs), application-specific integrated circuits (ASICs), radio-frequency integrated circuits (RFICs), and combinations of various hardware and logic circuitry for performing at least the functions described herein. In some embodiments, the functional elements may refer to one or more processes operating on one or more processing elements.

In a typical electronic system, there are various antennas situated on the same system along with digital circuits. The RF frequencies that may be associated with these antennas are listed in the following Table 1.

TABLE 1

| RF technology | Minimum Frequency (MHz) | Maximum Frequency (MHz) |
|---|---|---|
| Wi-Fi 2.4 GHz | 2400 | 2495 |
| Wi-Fi 5 GHz | 5030 | 5875 |
| Wi-Fi 6E | 5925 | 7125 |
| Bluetooth | 2400 | 2483.5 |
| GPS and GLONASS | 1164 | 1610 |
| LTE | 700 | 5900 |
| 5G mmWave (mmW) | 24250 | 52600 |
| Satellite (Ku-Band) | 12000 | 18000 |

Figure 5:
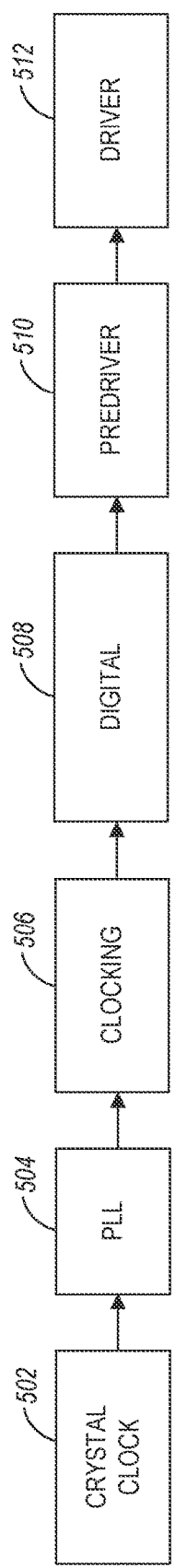
FIG. 5 illustrates a diagram of a transmit (Tx) section of a high-speed interface, which can be a source of interfering signals mitigated using the disclosed techniques, in accordance with some embodiments.

FIG. 5 illustrates a diagram of a transmit (Tx) section 500 of a high-speed interface in the SoC or in the Application Processor, which can be a source of interfering signals mitigated using the disclosed techniques, in accordance with some embodiments. Referring to FIG. 5, the Tx section 500 includes a crystal clock 502, a phase-locked loop (PLL) circuit 504, a clocking circuit (e.g., an oscillator) 506, digital signal processing circuitry 508, a pre-driver circuit 510, and a driver circuit 512.

The digital circuits in FIG. 5 represent an example Tx section which may be associated with different interfaces. For example, the Tx section 500 may include single-ended interfaces (DDRx, LPDDRx) and differential interfaces (USBx, PCIEx, SATAx, Thunderbolt). These high-speed circuits have internal clock distributions (e.g., clocking circuit 506) as well as PLLs (e.g., PLL circuit 504) and crystal clocks (e.g., a crystal clock 502) which are at the input of these circuits and can be the source of interfering signals. Similarly in the Rx section of these high-speed interfaces, there will be crystal clock, PLL, clocking circuitry, digital section, and sampler and receiver circuitry. These circuits can be sources of interfering signals as well. For example, LPDDR5 interface operates at 6400 MT/sec which can generate RF noise at 6.4 GHz to interfere with the Wi-Fi band and Wi-Fi processing of the device. PCIe Gen 5 interface operates at 32 GT/sec which can generate RF noise in the 5G mmW bands.

Figure 6:
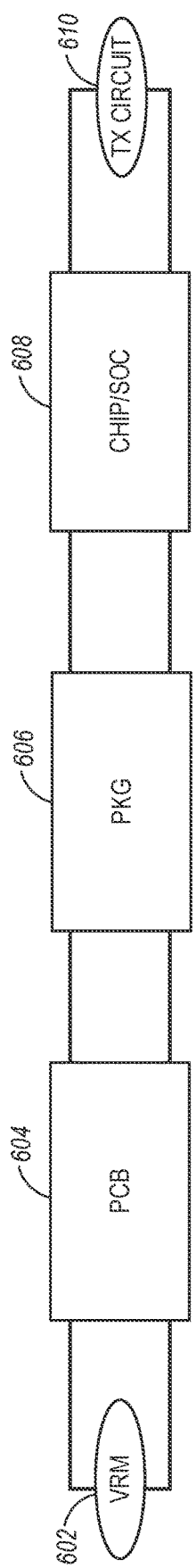
FIG. 6 illustrates a diagram of a power delivery network (PDN), in accordance with some embodiments.

FIG. 6 illustrates a diagram of a power delivery network (PDN) 600, in accordance with some embodiments. Referring to FIG. 6, the PDN 600 includes a voltage regulator module (VRM) 602, a printed circuit board (PCB) 604, a package 606, and silicon (or chip/SoC) 608, and a circuit 610. Circuit 610 is at least one of the circuits in the Tx chain 500 or another circuit generating an interfering signal which can be coupled onto the PDN 600 and interfere with the device antenna or other circuits. The circuit is not limited to a Tx chain circuit and can include any type of digital circuitry such as a receive (Rx) chain circuit of a high-speed interface or another type of circuit that is an interfering signal source.

The VRM 602 is a power signal source. In some aspects, the power signal source is a Power Management Integrated Circuit (PMIC), or another circuit, which feeds power to the PCB 604. The package 606 is mounted on the PCB 604 which has an SoC 609. In some aspects, different decoupling elements on the PCB 604 may be used, such as bulk capacitors, edge capacitors, or ferrite beads. The edge capacitors are placed near the SoC 609. These capacitors have equivalent series inductance and can be used to mitigate signal interference from circuit 610. There are inductances associated with the PCB 604 and package 606, which can influence the effectiveness of these capacitors. On-chip power delivery elements of the PDN 600 include on-chip power grid routings such as power rails, intentional decoupling capacitors, and intrinsic capacitors. Such capacitors may be placed close to circuit 610 to mitigate the PDN induced interfering signals. However, the capacitors consume a significant amount of die area and may be expensive to implement.

Figure 7:
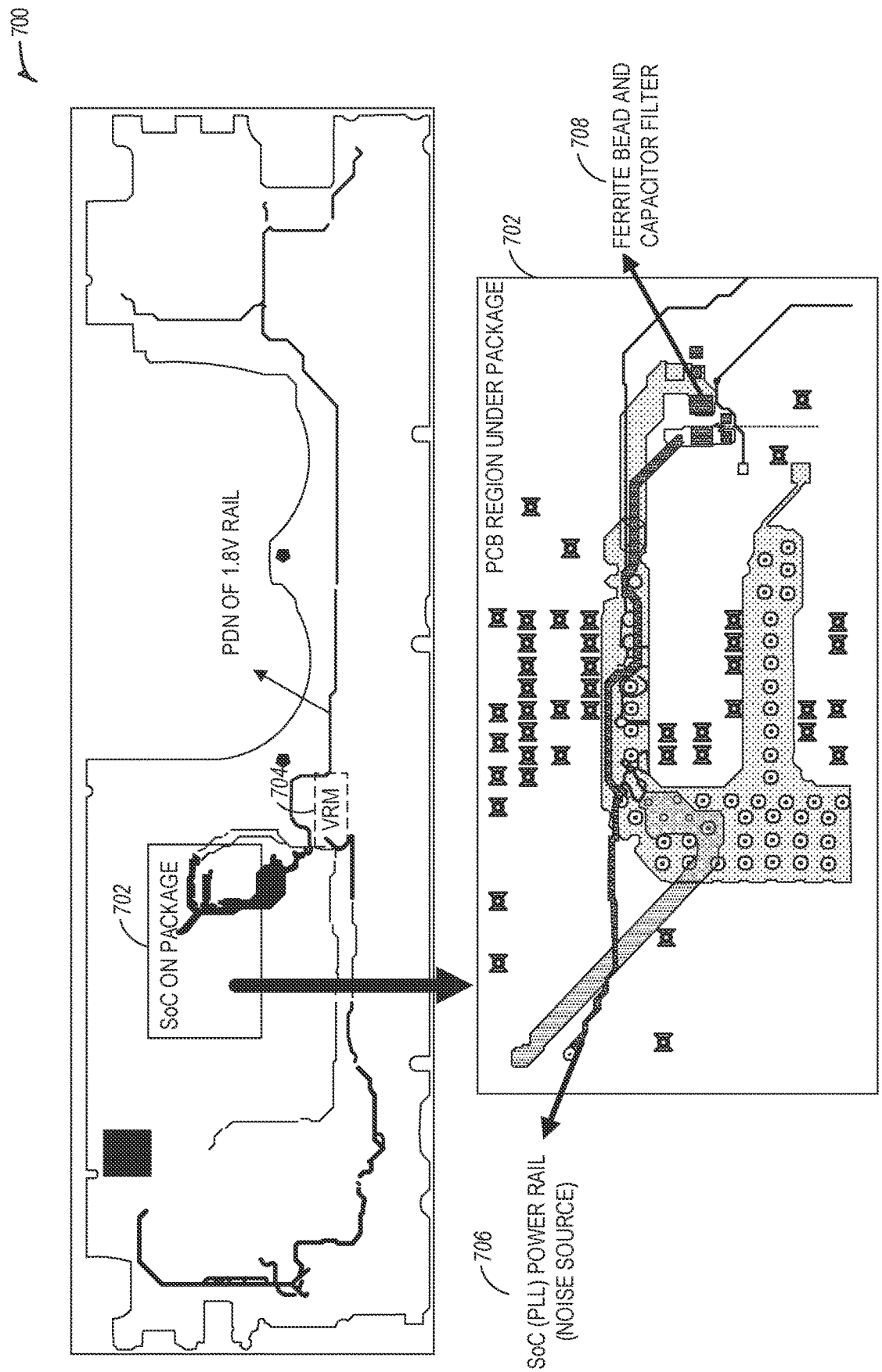
FIG. 7 illustrates an example PCB using ferrite beads and capacitor filters to mitigate interfering signals, in accordance with some embodiments.

FIG. 7 illustrates diagram 700 of an example PCB using ferrite beads and capacitor filters to mitigate interfering signals, in accordance with some embodiments. More specifically, FIG. 7 illustrates an example of the PDN routing on the PCB for the clocking circuit of FIG. 5. FIG. 7 illustrates a PCB with SoC 702 receiving power signals from a PDN associated with VRM 704. More specifically, the VRM 704 can deliver power signals to the SoC 702 via power rail (e.g., a copper trace) 706. On the PCB, the IR drop and decoupling components may be considered and the overall structure of the PDN can be similar to diagram 700 in FIG. 7. A ferrite bead and capacitor filter 708 may be added to the power rail 706 to filter out noise in the 5 GHz Wi-Fi band which may be generated by the SoC circuit and may be coupled onto the PDN. The PDN can radiate interfering signal noise which can couple to the antenna and deteriorate RF performance of the wireless device.

Figure 8:
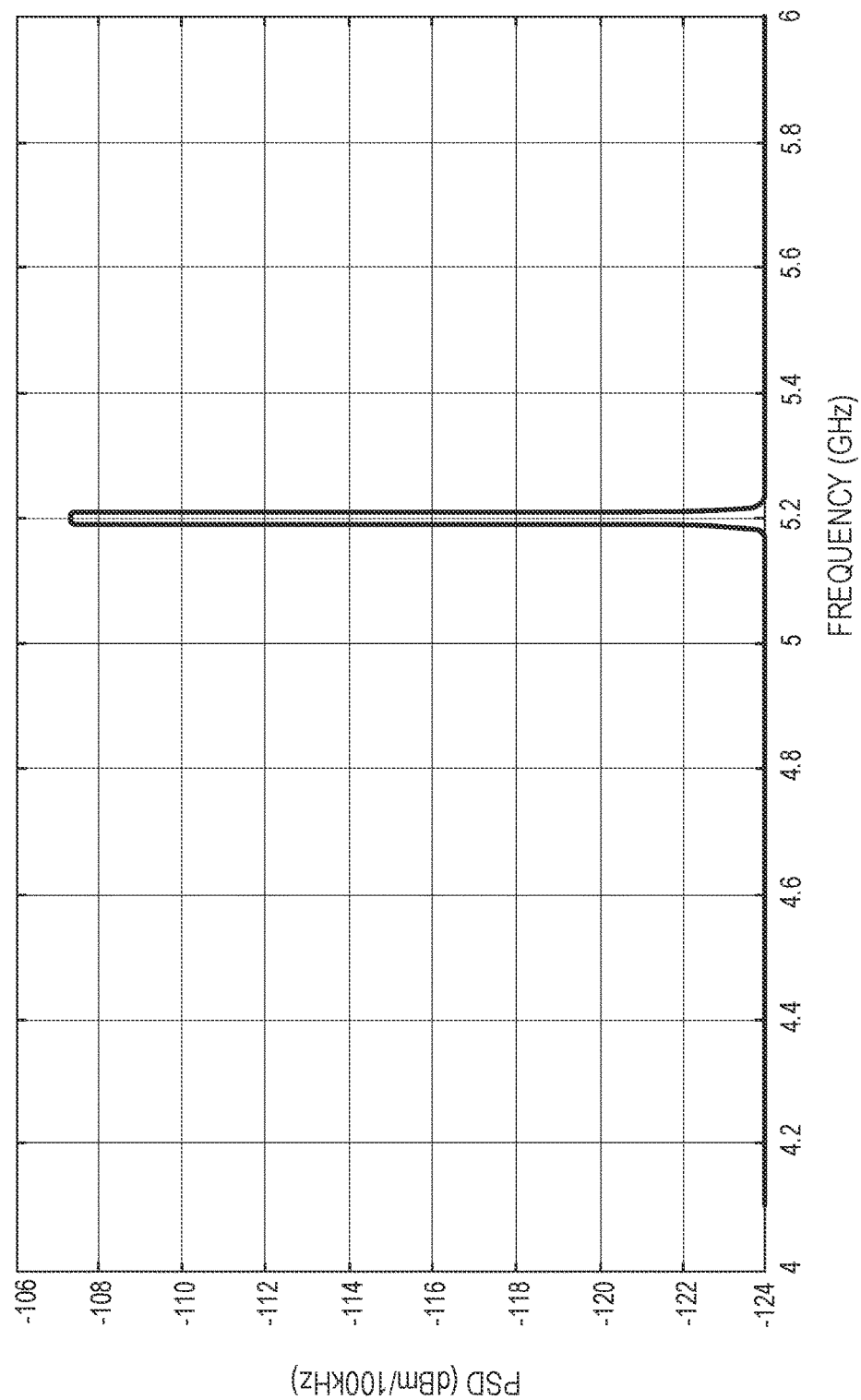
FIG. 8 is a graph illustrating signal noise coupled to a Wi-Fi antenna caused by PDN induced interference.

FIG. 8 is graph 800 illustrating signal noise coupled to a Wi-Fi antenna caused by PDN induced interference. For determining coupling to the antenna structure, the following procedure may be followed. Based on the existing system design, a PDN of 300 mm length is taken for analysis as an RF noise source. A Wi-Fi antenna is placed one inch away from the PDN routing (which is the noise source). The PDN is excited with a 5.2 GHz noise. The power spectral density (PSD) at the antenna port is calculated, which is a measure of noise received by the Wi-Fi antenna, and is illustrated by graph 800 in FIG. 8.

In some embodiments, disclosed techniques in connection with a SIF may be used to mitigate a coupling to the antenna structure. More specifically, a power rail of the PDN may be modified to implement segments of a filtering component. In some aspects, the filtering component segments may be modified taking into consideration the filtering aspects of the filtering component. In some aspects, a stepped impedance filter (SIF) may be used as the filtering component.

Figure 9:
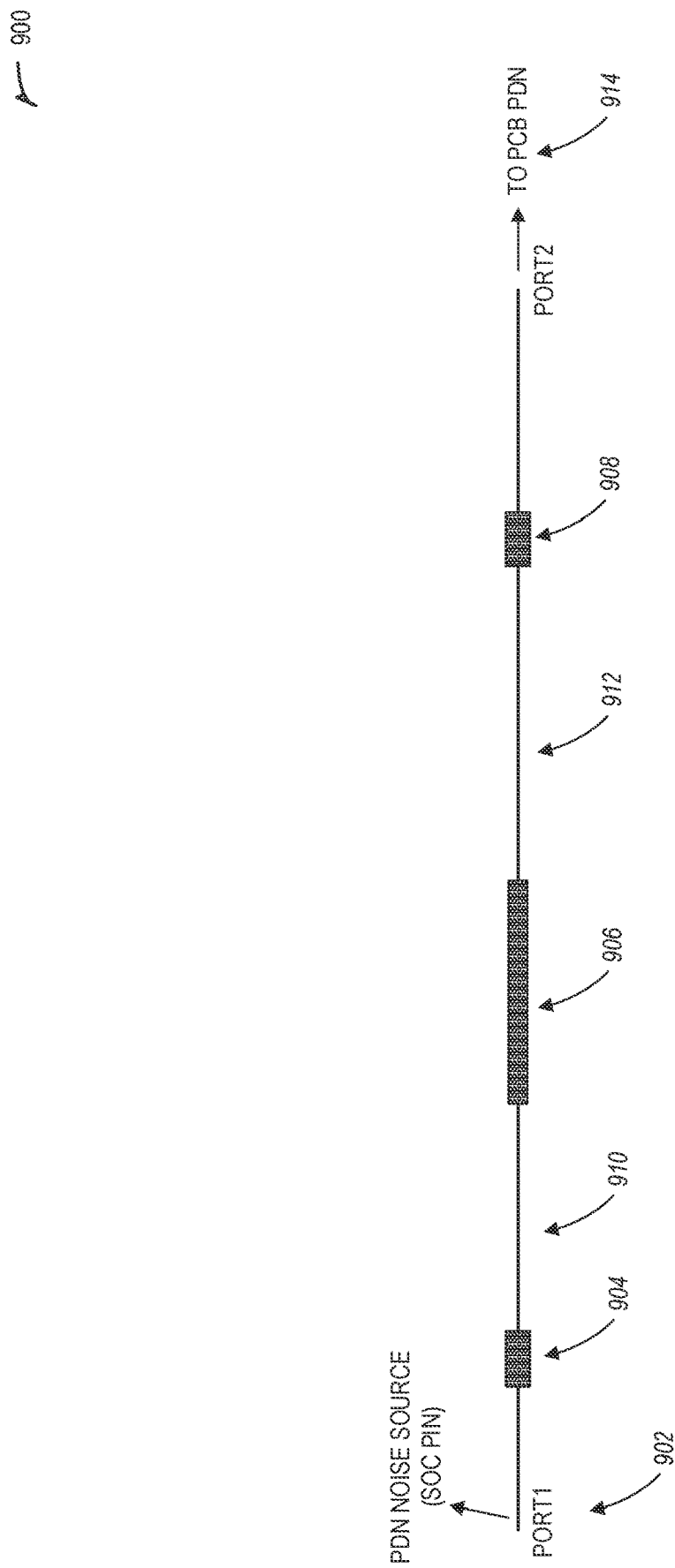
FIG. 9 is a diagram of a SIF which can be used to reduce PDN induced interference, in accordance with some embodiments.

FIG. 9 is a diagram of a SIF 900 which can be used as a low-pass filter to reduce PDN induced interference, in accordance with some embodiments. The SIF 900 is coupled to a PDN noise source (e.g., package pin for powering a circuit) at connection port 902 and to a PCB of the PDN at connection port 914. In some embodiments, the SIF includes a first set of low impedance (or low-Z) components 904, 906, and 908, and the second set of high impedance (or high-Z) components 910 and 912.

In some embodiments, the dimensions of the low-Z components (e.g., length, width, and height) can be different among individual low-Z components. For example, the dimensions of low-Z components 904 and 908 may be the same, and the dimensions of low-Z components 904 and 906 may be different. Similarly, the dimensions of high-Z components 910 and 912 may be the same in one aspect or different in another aspect. In some embodiments, the SIF 900 includes low-Z and high-Z components that are serially connected. In some embodiments, the SIF 900 is formed by low-Z and high-Z components in an alternating fashion (e.g., a low-Z component is followed by a high-Z component followed by a low-Z component, etc.). In some embodiments, the dimensions of individual low-Z and high-Z components, as well as the total number of such components, can be configured based on one or more frequencies associated with one or more interfering signal present in the PDN (e.g., originating from one or more circuits coupled to the PDN). In some embodiments, the SIF can be configured as a low-pass filter by shaping (e.g., forming, cutting, depositing) a copper trace (e.g., power rail) of the PDN in a section that is close to the interfering signal (e.g., close to the SoC circuit).

Figure 10:
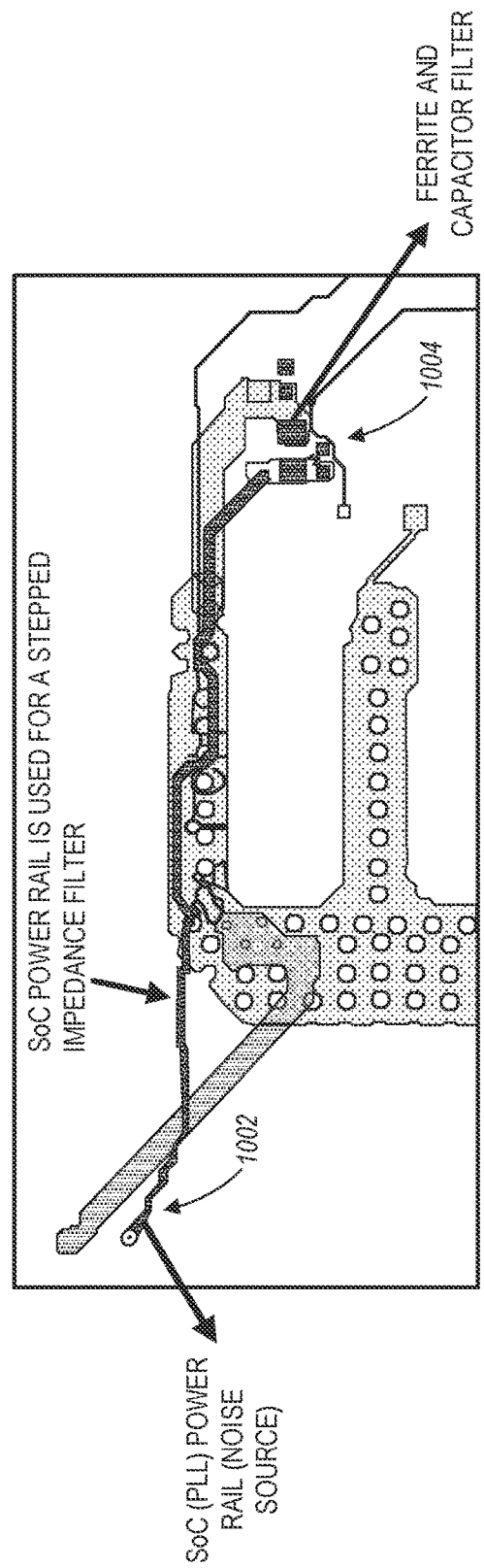
FIG. 10 illustrates an example printed circuit board (PCB) with a power rail which can be used for configuring a SIF, in accordance with some embodiments.
Figure 11:
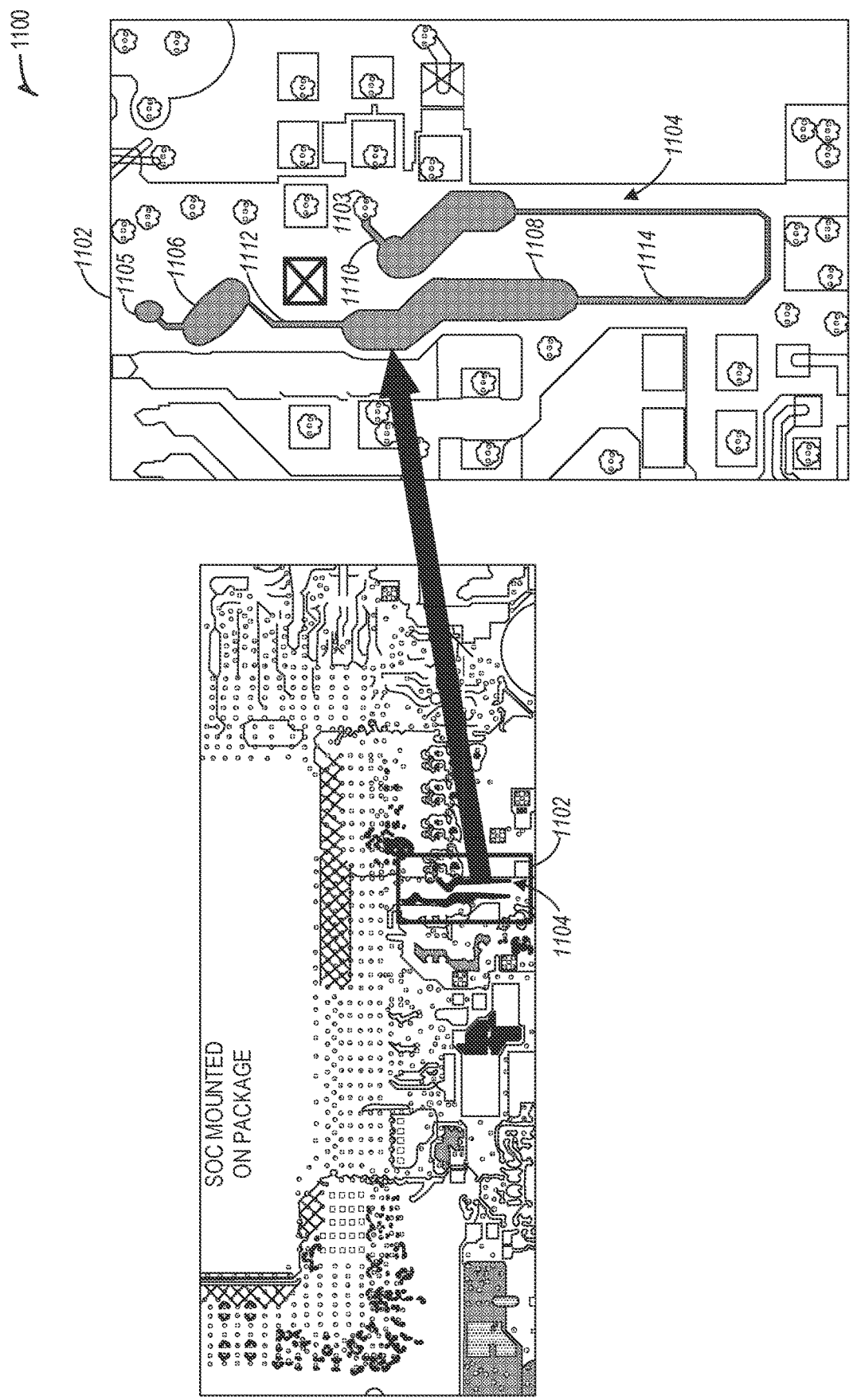
FIG. 11 illustrates a PCB and SoC using a SIF formed by a copper trace of a power rail of a PDN, in accordance with some embodiments.

FIG. 10 illustrates an example PCB 1000 with a power rail 1002 which can be used for configuring a SIF, in accordance with some embodiments. More specifically, power rail 1002 can include a portion that is configured (formed) as a SIF (e.g., as seen in FIG. 11) to filter out interfering signals. In this case, the ferrite bead and capacitor filter 1004 can be removed.

FIG. 11 illustrates diagram 1100 of a printed circuit board (PCB) 1102 and SoC with the package using a SIF 1104 formed by a copper trace of a power rail of a PDN, in accordance with some embodiments. Referring to FIG. 11, the PCB 1102 includes a power rail formed as SIF 1104. More specifically, SIF 1104 includes connection ports 1103 and 1105, as well as a plurality of segments 1106-1114 formed by the copper trace of the power rail. For example, the SIF 1104 includes low-Z segments 1106, 1108, and 1110, as well as high-Z segments 1112 and 1114.

Figure 12:
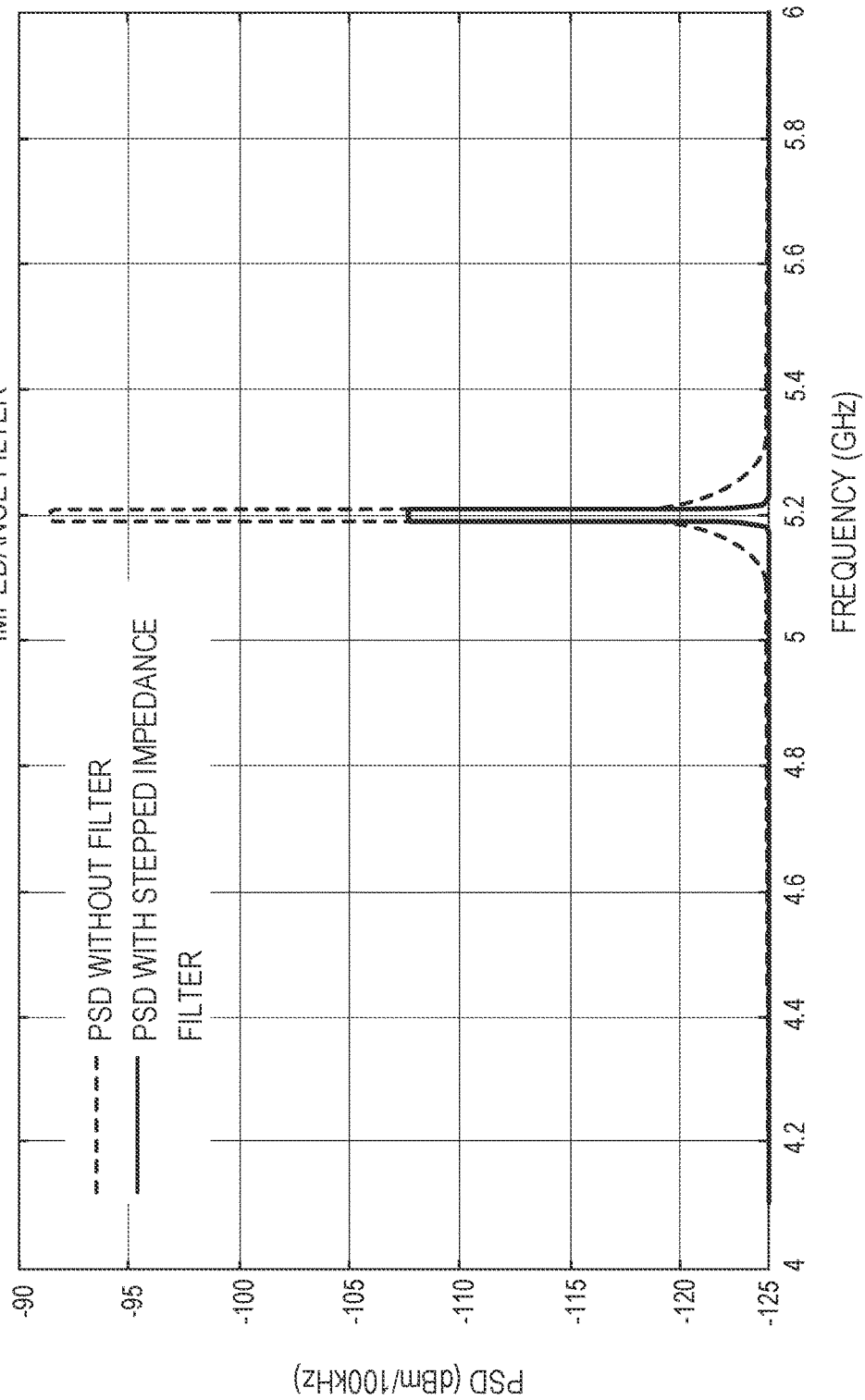
FIG. 12 is a graph illustrating signal noise coupled to a Wi-Fi antenna caused by PDN induced interference with and without the use of a disclosed SIF, in accordance with some embodiments.

FIG. 12 is graph 1200 illustrating signal noise coupled to a Wi-Fi antenna caused by PDN induced interference with and without the use of a disclosed SIF, in accordance with some embodiments.

Using the SIF 900, RF interference (RFI) may be simulated using a full-wave simulator. The resultant antenna noise coupling is shown in FIG. 12. The SIF provides 16 dB of noise attenuation in the 5 GHz to 6 GHz band. Noise attenuation of 16 dB provided by this invention is adequate to mitigate RFI issues. In a typical system design, a metal shield that is used to mitigate RFI issues provides noise attenuation of 10 to 15 dB, which is comparable to the interfering signal attenuation provided by the disclosed SIF filters.

Figure 13A:
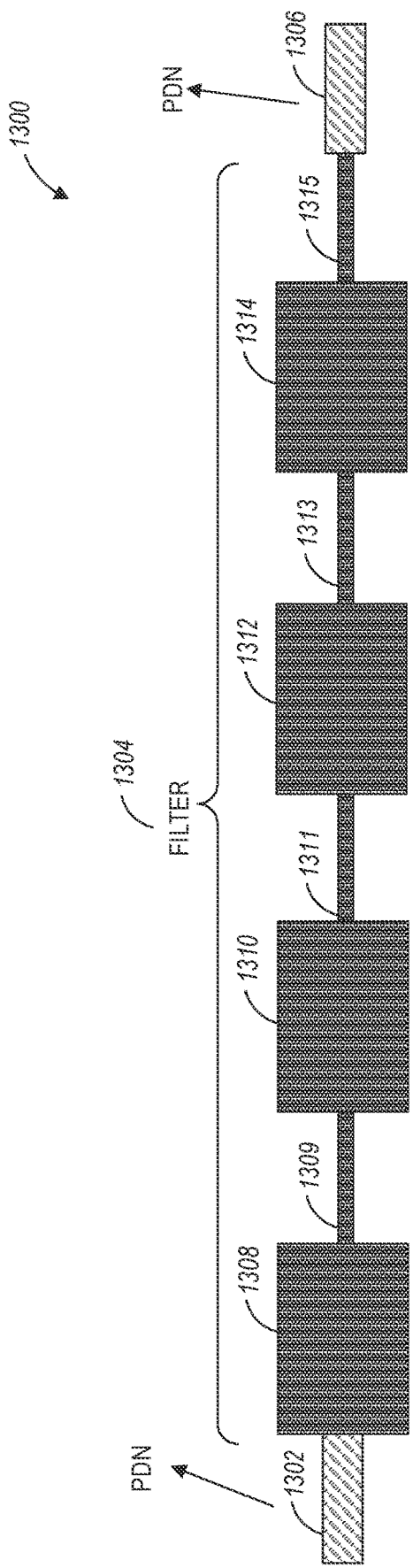
FIG. 13A and FIG. 13B illustrate diagrams of different implementations of a SIF which can be used for mitigating PDN induced interference, in accordance with some embodiments.
Figure 13B:
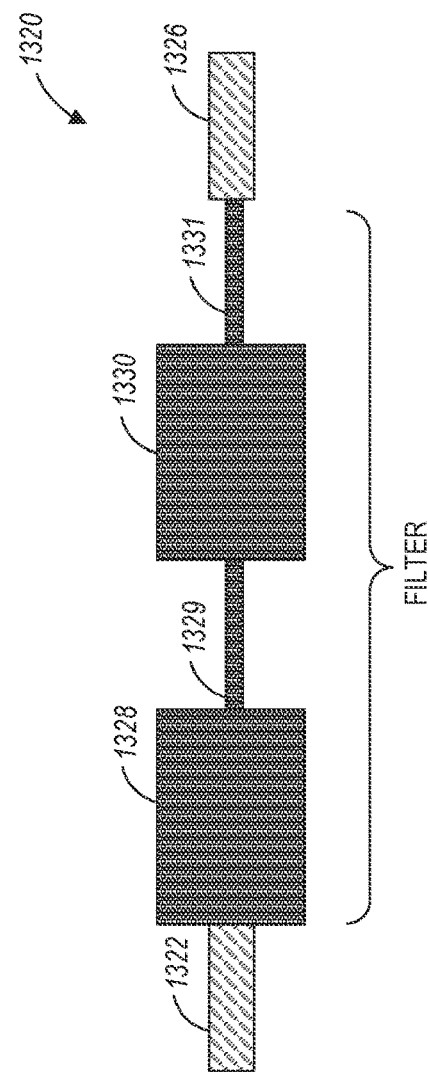

FIG. 13A and FIG. 13B illustrate diagrams of different implementations of a SIF which can be used for mitigating PDN induced interference, in accordance with some embodiments. FIG. 13A illustrates diagram 1300 of an example SIF 1304 coupled to connection ports 1302 and 1306. The SIF 1304 includes a plurality of segments 1308-1315 formed by a copper trace of the power rail. For example, the SIF 1304 includes low-Z segments 1308, 1310, 1312, and 1314, as well as high-Z segments 1309, 1311, 1313, and 1315.

FIG. 13B illustrates diagram 1320 of an example SIF 1324 coupled to connection ports 1322 and 1326. The SIF 1324 includes a plurality of segments 1328-1331 formed by a copper trace of the power rail. For example, the SIF 1324 includes low-Z segments 1328 and 1330, as well as high-Z segments 1329 and 1331.

In some aspects, the dimensions of the individual low-Z and high-Z components (as well as the number of components) can be configured based on a frequency (or frequencies) of interfering signals that have to be mitigated.

Figure 14:
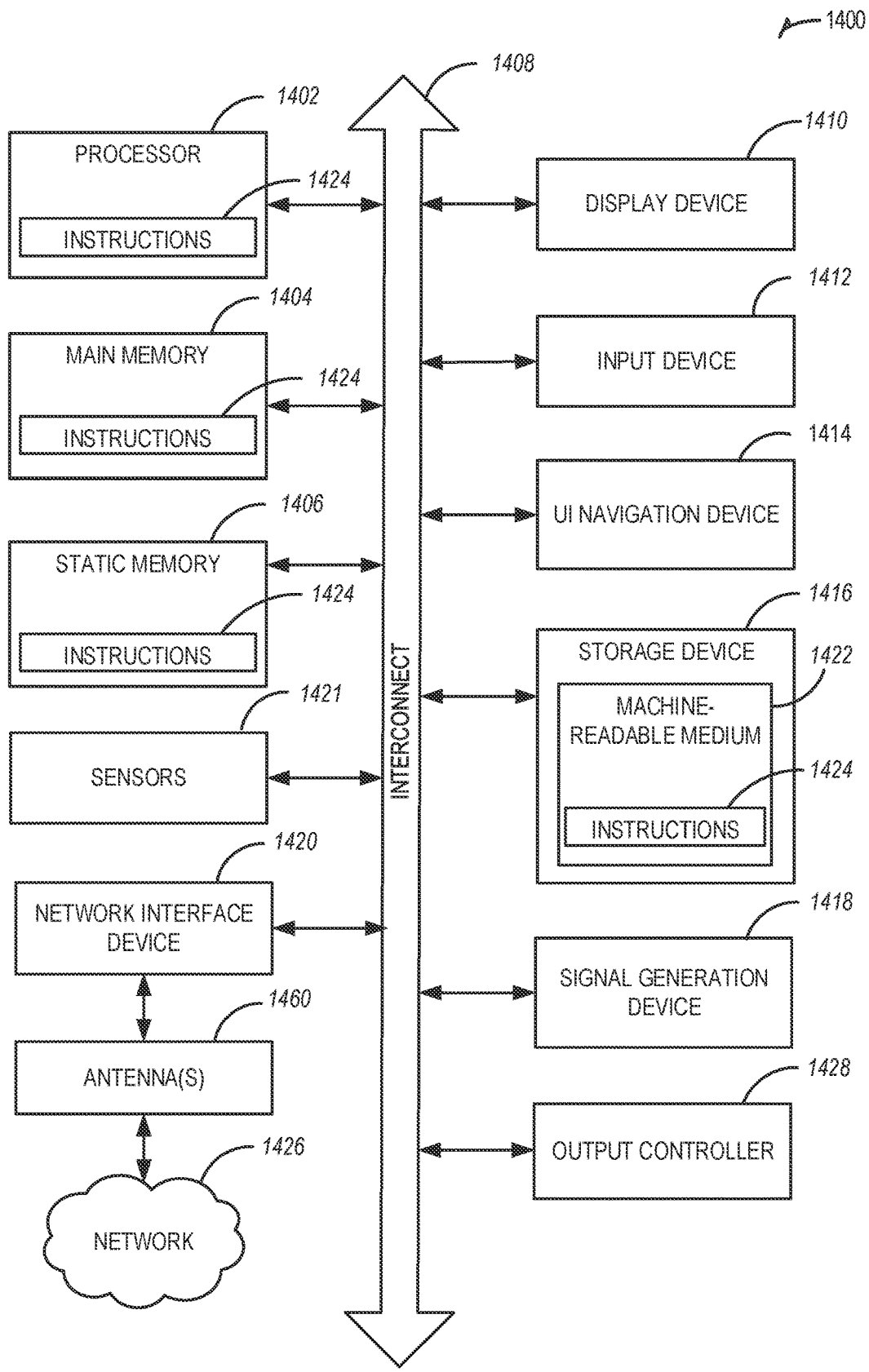
FIG. 14 illustrates a block diagram of an example machine upon which any one or more of the operations/techniques (e.g., methodologies) discussed herein may perform.

FIG. 14 illustrates a block diagram of an example machine 1400 upon which any one or more of the techniques (e.g., methodologies) discussed herein may perform. In alternative embodiments, the machine 1400 may operate as a standalone device or may be connected (e.g., networked) to other machines. In a networked deployment, machine 1400 may operate in the capacity of a server machine, a client machine, or both in server-client network environments. In an example, the machine 1400 may act as a peer machine in a peer-to-peer (P2P) (or other distributed) network environment. The machine 1400 may be a personal computer (PC), a tablet PC, a set-top box (STB), a personal digital assistant (PDA), a portable communications device, a mobile telephone, a smartphone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Machine (e.g., computer system) 1400 may include a hardware processor 1402 (e.g., a central processing unit (CPU), a graphics processing unit (GPU), a hardware processor core, or any combination thereof), a main memory 1404, and a static memory 1406, some or all of which may communicate with each other via an interlink (e.g., bus) 1408.

Specific examples of main memory 1404 include Random Access Memory (RAM), and semiconductor memory devices, which may include, in some embodiments, storage locations in semiconductors such as registers. Specific examples of static memory 1406 include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; RAM; and CD-ROM and DVD-ROM disks.

The machine 1400 may further include a display device 1410, an input device 1412 (e.g., a keyboard), and a user interface (UI) navigation device 1414 (e.g., a mouse). In an example, the display device 1410, input device 1412, and UT navigation device 1414 may be a touch screen display. The machine 1400 may additionally include a storage device (e.g., drive unit or another mass storage device) 1416, a signal generation device 1418 (e.g., a speaker), a network interface device 1420, and one or more sensors 1421, such as a global positioning system (GPS) sensor, compass, accelerometer, or other sensors. The machine 1400 may include an output controller 1428, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.). In some embodiments, the processor 1402 and/or instructions 1424 may comprise processing circuitry and/or transceiver circuitry.

The storage device 1416 may include a machine-readable medium 1422 on which is stored one or more sets of data structures or instructions 1424 (e.g., software) embodying or utilized by any one or more of the techniques or functions described herein. The instructions 1424 may also reside, completely or at least partially, within the main memory 1404, within static memory 1406, or within the hardware processor 1402 during execution thereof by the machine 1400. In an example, one or any combination of the hardware processor 1402, the main memory 1404, the static memory 1406, or the storage device 1416 may constitute machine-readable media.

Specific examples of machine-readable media may include non-volatile memory, such as semiconductor memory devices (e.g., EPROM or EEPROM) and flash memory devices; magnetic disks, such as internal hard disks and removable disks; magneto-optical disks; RAM; and CD-ROM and DVD-ROM disks.

While the machine-readable medium 1422 is illustrated as a single medium, the term "machine-readable medium" may include a single medium or multiple media (e.g., a centralized or distributed database, and/or associated caches and servers) configured to store one or more instructions 1424.

An apparatus of the machine 1400 may be one or more of a hardware processor 1402 (e.g., a central processing unit (CPU), a graphics processing unit (GPU), a hardware processor core, or any combination thereof), a main memory 1404 and a static memory 1406, one or more sensors 1421, a network interface device 1420, antennas 1460, a display device 1410, an input device 1412, a UI navigation device 1414, a storage device 1416, instructions 1424, a signal generation device 1418, and an output controller 1428. The apparatus may be configured to perform one or more of the methods and/or operations disclosed herein. The apparatus may be intended as a component of the machine 1400 to perform one or more of the methods and/or operations disclosed herein, and/or to perform a portion of one or more of the methods and/or operations disclosed herein. In some embodiments, the apparatus may include a pin or other means to receive power. In some embodiments, the apparatus may include power conditioning hardware.

The term "machine-readable medium" may include any medium that is capable of storing, encoding, or carrying instructions for execution by the machine 1400 and that cause the machine 1400 to perform any one or more of the techniques of the present disclosure, or that is capable of storing, encoding or carrying data structures used by or associated with such instructions. Non-limiting machine-readable medium examples may include solid-state memories and optical and magnetic media. Specific examples of machine-readable media may include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks. In some examples, machine-readable media may include non-transitory machine-readable media. In some examples, machine-readable media may include machine-readable media that is not a transitory propagating signal.

The instructions 1424 may further be transmitted or received over a communications network 1426 using a transmission medium via the network interface device 1420 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fit, IEEE 802.16 family of standards known as WiMax®), IEEE 802.15.4 family of standards, a Long Term Evolution (LTE) family of standards, a Universal Mobile Telecommunications System (UMTS) family of standards, peer-to-peer (P2P) networks, 5G networks, satellite networks, among others.

In an example, the network interface device 1420 may include one or more physical jacks (e.g., Ethernet, coaxial, or phone jacks) or one or more antennas to connect to the communications network 1426. In an example, the network interface device 1420 may include one or more antennas 1460 to wirelessly communicate using at least one of single-input multiple-output (SIMO), multiple-input multiple-output (MIMO), or multiple-input single-output (MISO) techniques. In some examples, the network interface device 1420 may wirelessly communicate using Multiple User MIMO techniques. The term "transmission medium" shall be taken to include any intangible medium that is capable of storing, encoding, or carrying instructions for execution by the machine 1400, and includes digital or analog communications signals or other intangible media to facilitate communication of such software.

Examples, as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or concerning external entities such as other circuits) in a specified manner as a module. In an example, the whole or part of one or more computer systems (e.g., a standalone, client, or server computer system) or one or more hardware processors may be configured by firmware or software (e.g., instructions, an application portion, or an application) as a module that operates to perform specified operations. In an example, the software may reside on a machine-readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using the software, the general-purpose hardware processor may be configured as respective different modules at different times. The software may accordingly configure a hardware processor, for example, to constitute a particular module at one instance of time and to constitute a different module at a different instance of time.

Some embodiments may be implemented fully or partially in software and/or firmware. This software and/or firmware may take the form of instructions contained in or on a non-transitory computer-readable storage medium. Those instructions may then be read and executed by one or more processors to enable the performance of the operations described herein. The instructions may be in any suitable form, such as but not limited to source code, compiled code, interpreted code, executable code, static code, dynamic code, and the like. Such a computer-readable medium may include any tangible non-transitory medium for storing information in a form readable by one or more computers, such as but not limited to read-only memory (ROM); random access memory (RAM); magnetic disk storage media; optical storage media; flash memory, etc.

The above-detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplated are examples using any combination or permutation of those elements shown or described (or one or more aspects thereof), either with respect to a particular example (or one or more aspects thereof) or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels and are not intended to suggest a numerical order for their objects.

The embodiments as described above may be implemented in various hardware configurations that may include a processor for executing instructions that perform the techniques described. Such instructions may be contained in a machine-readable medium such as a suitable storage medium or a memory or other processor-executable medium.

The embodiments as described herein may be implemented in a number of environments such as part of a wireless local area network (WLAN), 3rd Generation Partnership Project (3GPP) Universal Terrestrial Radio Access Network (UTRAN), or Long-Term-Evolution (LTE) or a Long-Term-Evolution (LTE) communication system, 5G networks, satellite network, although the scope of the disclosure is not limited in this respect.

Antennas referred to herein may comprise one or more directional or omnidirectional antennas, including, for example, dipole antennas, monopole antennas, patch antennas, loop antennas, microstrip antennas, or other types of antennas suitable for transmission of RF signals. In some embodiments, instead of two or more antennas, a single antenna with multiple apertures may be used. In these embodiments, each aperture may be considered a separate antenna. In some multiple-input multiple-output (MIMO) embodiments, antennas may be effectively separated to take advantage of spatial diversity and the different channel characteristics that may result between each of antennas and the antennas of a transmitting station. In some MIMO embodiments, antennas may be separated by up to 1/10 of a wavelength or more.

ADDITIONAL NOTES AND EXAMPLES

Example 1 is a power delivery apparatus comprising: a voltage regulator circuit configured to generate a power signal; a printed circuit board (PCB) comprising a power rail to deliver the power signal to a transmit (Tx) or Receiver (Rx) chain circuit or any other digital circuit; and a filtering element configured to filter an interfering signal generated by the Tx or Rx chain circuit or any other digital circuit, the filtering element comprising: a first set of low impedance (low-Z) segments; and a second set of high impedance (high-Z) segments, the low-Z, and high-Z segments formed using a copper trace of the power rail and being serially connected.

In Example 2, the subject matter of Example 1 includes, a system-on-a-chip (SoC) mounted on a package coupled to the PCB, the SoC configured to receive the Tx or Rx chain circuit.

In Example 3, the subject matter of Example 2 includes, wherein the filtering element is disposed on a section of the power rail between the PCB and the Tx or Rx chain circuit. In all the below examples, the Tx (or Rx) chain circuit is at the SoC or chip, which is a source of interference. The coupling source may not be limited to Tx and Rx chain circuits but may also include other digital circuits. Power Delivery Network is connecting the SoC and different circuits. For example, the interfering signal travels from Tx (or Rx) chain circuit or any other digital circuit to the PDN, and through PDN radiatively couples to destination antennas and circuits.

In Example 4, the subject matter of Examples 1-3 includes, wherein the filtering element is a stepped impedance filter configured to filter out a high-frequency signal component of the interfering signal.

In Example 5, the subject matter of Example 4 includes, wherein the Tx chain circuit (or Rx chain circuit or any other digital circuit) is generating an interfering signal (e.g., harmonics) affecting a Wi-Fi antenna (or other circuits) through the PDN via signal radiation, and the high-frequency signal component filtered out by the stepped impedance filter is within a frequency range of 2.4 GHz-2.5 GHz, 5 GHz-5.875 GHz, or 5.925 GHz-7.125 GHz.

In Example 6, the subject matter of Examples 4-5 includes, wherein the Tx chain circuit (or Rx chain circuit or any other digital circuit) is generating interfering signal/harmonics affecting a Bluetooth antenna and the circuit through the PDN via signal radiation and the high-frequency signal component filtered out by the stepped impedance filter is within a frequency range of 2.4 GHz-2.5 GHz.

In Example 7, the subject matter of Examples 4-6 includes, wherein the Tx chain circuit (or Rx chain circuit or any other digital circuit) is generating interfering signal/harmonics affecting the antenna and the circuit configured to process navigation signals through the PDN via signal radiation and the high-frequency signal component filtered out by the stepped impedance filter is within a frequency range of 1.1 GHz-1.7 GHz.

In Example 8, the subject matter of Examples 4-7 includes, wherein the Tx chain circuit (or Rx chain circuit or any other digital circuit) is generating interfering signal/harmonics affecting the antenna and the circuit configured to process LTE signals through the PDN via signal radiation and the high-frequency signal component filtered out by the stepped impedance filter is within a frequency range of 700 MHz-5.9 GHz.

In Example 9, the subject matter of Examples 4-8 includes, wherein the Tx chain circuit (or Rx chain circuit or any other digital circuit) is generating signal/harmonics to interfere the antenna and the circuit configured to process 5G mm-wave (mmW) signals through the PDN via signal radiation and the high-frequency signal component filtered out by the stepped impedance filter is within a frequency range of 24.2 GHz-52.6 GHz.

In Example 10, the subject matter of Examples 1-9 includes, wherein the first set of low-Z segments are associated with a first set of dimensions, and the second set of high-Z segments are associated with a second set of dimensions, the first set of dimensions being different from the second set of dimensions.

In Example 11, the subject matter of Example 10 includes, wherein each low-Z segment of the first set is associated with dimensions that are higher than dimensions of a high-Z segment of the second set.

In Example 12, the subject matter of Examples 10-11 includes, wherein the first set of low-Z segments and the second set of high-Z segments of the filtering element are configured with the first set of dimensions and the second set of dimensions respectively, based on a frequency of the interfering signal.

In Example 13, the subject matter of Examples 1-12 includes, wherein the filtering element comprises an equal number of low-Z segments of the first set and high-Z segments of the second set.

In Example 14, the subject matter of Examples 1-13 includes, wherein the first set of low-Z segments and the second set of high-Z segments are coupled in series and alternating with each other along a length of the copper trace of the power rail.

Example 15 is an electronics system comprising: front-end circuitry for at least one of Wi-Fi, Bluetooth, and cellular; and a power delivery network (PDN) configured to generate a power signal for powering the front-end circuitry, the PDN comprising: a voltage regulator circuit configured to generate the power signal; a printed circuit board (PCB) comprising a power rail to deliver the power signal to the front-end circuitry (e.g., SoC associated with the front-end circuitry); and a stepped impedance filter (SIF) conductively coupled to the PCB, and configured to filter an interfering signal generated by the front-end circuitry (e.g., Tx chain circuit, Rx chain circuit, or any other digital circuit), the SIF comprising a plurality of segments formed by a copper trace of the power rail.

In Example 16, the subject matter of Example 15 includes, wherein the SIF comprises, a first set of low impedance (low-Z) segments; and a second set of high impedance (high-Z) segments, the low-Z, and high-Z segments being serially connected to each other.

In Example 17, the subject matter of Example 16 includes, wherein the first set of low-Z segments are associated with a first set of dimensions and the second set of high-Z segments are associated with a second set of dimensions, and wherein at least one of length, width, or height of the first set of dimensions is different from the corresponding length, width, or height of the second set of dimensions.

In Example 18, the subject matter of Example 17 includes, wherein the first set of low-Z segments and the second set of high-Z segments of the SIF are configured with the first set of dimensions and the second set of dimensions respectively, based on a frequency of the interfering signal.

Example 19 is a stepped impedance filter (SIF) for filtering an interfering signal generated by a circuit, the SIF comprising: a first set of low impedance (low-Z) segments; and a second set of high impedance (high-Z) segments, the low-Z and high-Z segments having a rectangular shape, being different from each other, and being serially connected, and wherein the low-Z and high-Z segments are formed using a copper trace conducting a power signal that powers the circuit.

In Example 20, the subject matter of Example 19 includes, wherein the first set of low-Z segments are associated with a first set of dimensions, the second set of high-Z segments are associated with a second set of dimensions, the first set of dimensions being different from the second set of dimensions, and wherein the low-Z segments and the high-Z segments are coupled in series and alternating with each other along a length of the copper trace.

Example 21 is at least one machine-readable medium including instructions that, when executed by processing circuitry, cause the processing circuitry to perform operations to implement any of Examples 1-20.

Example 22 is an apparatus comprising means to implement of any of Examples 1-20.

Example 23 is a system to implement any of Examples 1-20.

Example 24 is a method to implement any of Examples 1-20.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure. It is submitted with the understanding that it will not be used to interpret or limit the scope or meaning of the claims. Also, in the above Detailed Description, various features may be grouped to streamline the disclosure. However, the claims may not set forth every feature disclosed herein as embodiments may feature a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined regarding the appended claims, along with the full scope of equivalents to which such claims are entitled.

What is claimed is:

1. A power delivery apparatus comprising:
    a voltage regulator circuit configured to generate a power signal;
    a printed circuit board (PCB) comprising a power rail to deliver the power signal to a digital circuit; and
    a filtering element configured to filter an interfering signal generated by the digital circuit, the filtering element comprising:
        a first set of low impedance (low-Z) segments; and
        a second set of high impedance (high-Z) segments, the low-Z and high-Z segments formed using a copper trace of the power rail and being serially connected to each other.

2. The power delivery apparatus of claim 1, further comprising:
    a system-on-a-chip (SoC) mounted on a package coupled to the PCB, the SoC configured to include the digital circuit.

3. The power delivery apparatus of claim 2, wherein the filtering element is disposed on a section of the power rail between the PCB and the digital circuit.

4. The power delivery apparatus of claim 1, wherein the filtering element is a stepped impedance filter configured to filter out a high-frequency signal component of the interfering signal.

5. The power delivery apparatus of claim 4, wherein the interfering signal generated by the digital circuit is affecting Wi-Fi circuitry of a computing device and the high-frequency signal component filtered out by the stepped impedance filter is within a frequency range of 2.4 GHz-2.5 GHz, 5 GHz-5.875 GHz, or 5.925 GHz-7.125 GHz.

6. The power delivery apparatus of claim 4, wherein the interfering signal generated by the digital circuit is affecting Bluetooth circuitry of a computing device and the high-frequency signal component filtered out by the stepped impedance filter is within a frequency range of 2.4 GHz-2.5 GHz.

7. The power delivery apparatus of claim 4, wherein the interfering signal generated by the digital circuit is affecting circuitry of a computing device and the high-frequency signal component filtered out by the stepped impedance filter is within a frequency range of 1.1 GHz-1.7 GHz.

8. The power delivery apparatus of claim 4, wherein the interfering signal generated by the digital circuit is affecting LTE circuitry of a computing device and the high-frequency signal component filtered out by the stepped impedance filter is within a frequency range of 700 MHz-5.9 GHz.

9. The power delivery apparatus of claim 4, wherein the interfering signal generated by the digital circuit is affecting mmW circuitry of a computing device and the high-frequency signal component filtered out by the stepped impedance filter is within a frequency range of 24.2 GHz-52.6 GHz.

10. The power delivery apparatus of claim 1, wherein the first set of low-Z segments are associated with a first set of dimensions, and the second set of high-Z segments are associated with a second set of dimensions, the first set of dimensions being different from the second set of dimensions.

11. The power delivery apparatus of claim 10, wherein each low-Z segment of the first set is associated with dimensions that are higher than dimensions of a high-Z segment of the second set.

12. The power delivery apparatus of claim 10, wherein the first set of low-Z segments and the second set of high-Z segments of the filtering element are configured with the first set of dimensions and the second set of dimensions respectively, based on a frequency of the interfering signal.

13. The power delivery apparatus of claim 1, wherein the filtering element comprises an equal number of low-Z segments of the first set and high-Z segments of the second set.

14. The power delivery apparatus of claim 1, wherein the first set of low-Z segments and the second set of high-Z segments are coupled in series and alternating with each other along a length of the copper trace of the power rail.

15. An electronics system comprising:
    front-end circuitry configured to generate at least one transmit signal; and a power delivery network (PDN) configured to generate a power signal for powering the front-end circuitry, the PDN comprising:
- a voltage regulator circuit configured to generate the power signal;
- a printed circuit board (PCB) comprising a power rail to deliver the power signal to the front-end circuitry; and
- a stepped impedance filter (SIF) conductively coupled to the PCB and configured to filter an interfering signal generated by the front-end circuitry, the SIF comprising a plurality of segments formed by a copper trace of the power rail.

16. The electronics system of claim 15, wherein the SIF comprises:
- a first set of low impedance (low-Z) segments; and
- a second set of high impedance (high-Z) segments, the low-Z and high-Z segments being serially connected to each other.

17. The electronics system of claim 16, wherein the first set of low-Z segments are associated with a first set of dimensions and the second set of high-Z segments are associated with a second set of dimensions, and wherein at least one of length, width, or height of the first set of dimensions is different from a corresponding length, width, or height of the second set of dimensions.

18. The electronics system of claim 17, wherein the first set of low-Z segments and the second set of high-Z segments of the SF are configured with the first set of dimensions and the second set of dimensions respectively, based on a frequency of the interfering signal.

19. A stepped impedance filter (SIF) for filtering an interfering signal generated by a circuit, the SIF comprising:
- a first set of low impedance (low-Z) segments; and
- a second set of high impedance (high-Z) segments, the low-Z and high-Z segments having a rectangular shape, being different from each other, and being serially connected, and wherein the low-Z and high-Z segments are formed using a copper trace conducting a power signal that powers the circuit.

20. The SIF of claim 19, wherein the first set of low-Z segments are associated with a first set of dimensions, the second set of high-Z segments are associated with a second set of dimensions, the first set of dimensions being different from the second set of dimensions, and wherein the low-Z segments and the high-Z segments are coupled in series and alternating with each other along a length of the copper trace.

* * * * *

UNITED STATES PATENT AND TRADEMARK OFFICE
CERTIFICATE OF CORRECTION

PATENT NO. : 12,016,113 B2
APPLICATION NO. : 17/131501
DATED : June 18, 2024
INVENTOR(S) : Pandit et al.

Page 1 of 1

It is certified that error appears in the above-identified patent and that said Letters Patent is hereby corrected as shown below:

In the Claims

In Column 22, Line 5, in Claim 18, delete "SF" and insert --SIF-- therefor

Signed and Sealed this
Nineteenth Day of August, 2025

Coke Morgan Stewart
*Acting Director of the United States Patent and Trademark Office*